United States Patent
Ko et al.

(10) Patent No.: US 8,877,614 B2
(45) Date of Patent: Nov. 4, 2014

(54) SPACER FOR SEMICONDUCTOR STRUCTURE CONTACT

(75) Inventors: Chun-Hung Ko, Hemei Township (TW); Jyh-Huei Chen, Hsin-Chu (TW); Ming-Jie Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 313 days.

(21) Appl. No.: 13/272,875

(22) Filed: Oct. 13, 2011

(65) Prior Publication Data

US 2013/0092985 A1  Apr. 18, 2013

(51) Int. Cl.
  *H01L 29/78* (2006.01)
  *H01L 21/336* (2006.01)
  *H01L 21/20* (2006.01)
  *H01L 21/768* (2006.01)
  *H01L 29/66* (2006.01)

(52) U.S. Cl.
  CPC .... *H01L 21/76834* (2013.01); *H01L 21/76897* (2013.01); *H01L 29/66628* (2013.01); *H01L 29/66636* (2013.01)
  USPC .......... 438/478; 257/288; 257/E29.255; 257/E21.09; 257/E21.409

(58) Field of Classification Search
  USPC .......... 438/197, 478; 257/288, E29.255, 257/E21.09, E21.409
  See application file for complete search history.

(56) References Cited

U.S. PATENT DOCUMENTS

| | | |
|---|---|---|
| 5,858,830 A | 1/1999 | Yoo et al. |
| 6,462,373 B2 | 10/2002 | Shimizu et al. |
| 6,589,854 B2 | 7/2003 | Liu et al. |
| 6,653,194 B1 | 11/2003 | Park |
| 6,723,658 B2 | 4/2004 | Eissa et al. |

(Continued)

FOREIGN PATENT DOCUMENTS

| | | |
|---|---|---|
| JP | 2011-066052 A | 3/2011 |
| KR | 100326942 B1 | 3/2002 |

(Continued)

OTHER PUBLICATIONS

Sarajlic, E., et al., "Advanced plasma processing combined with trench isolation technology for fabrication and fast protyping of high aspect ratio MEMS in standards silicon wafer," Journal of Micromechanics and Microengineering, Aug. 20, 2004, pp. S70-S75, Intstitute of Physics Publishing.

(Continued)

*Primary Examiner* — Matthew W Such
*Assistant Examiner* — Monica D Harrison
(74) *Attorney, Agent, or Firm* — Slater and Matsil, L.L.P.

(57) ABSTRACT

An embodiment is a semiconductor structure. The semiconductor structure comprises an epitaxial region, a gate structure, a contact spacer, and an etch stop layer. The epitaxial region is in a substrate. A top surface of the epitaxial region is elevated from a top surface of the substrate, and the epitaxial region has a facet between the top surface of the substrate and the top surface of the epitaxial region. The gate structure is on the substrate. The contact spacer is laterally between the facet of the epitaxial region and the gate structure. The etch stop layer is over and adjoins each of the contact spacer and the top surface of the epitaxial region. A ratio of an etch selectivity of the contact spacer to an etch selectivity of the etch stop layer is equal to or less than 3:1.

20 Claims, 5 Drawing Sheets

(56) References Cited

U.S. PATENT DOCUMENTS

| | | |
|---|---|---|
| 6,849,519 B2 | 2/2005 | Dong |
| 6,929,992 B1 * | 8/2005 | Djomehri et al. ............. 438/199 |
| 7,002,210 B2 | 2/2006 | Taya |
| 7,037,785 B2 | 5/2006 | Dong et al. |
| 7,115,940 B2 | 10/2006 | Sumino et al. |
| 7,151,043 B2 | 12/2006 | Kim et al. |
| 7,303,957 B2 | 12/2007 | Chi et al. |
| 7,348,634 B2 | 3/2008 | Furukawa et al. |
| 7,382,015 B2 | 6/2008 | Iguchi et al. |
| 7,504,304 B2 | 3/2009 | Yaegashi et al. |
| 7,566,651 B2 | 7/2009 | Wong et al. |
| 7,652,334 B2 | 1/2010 | Furukawa et al. |
| 7,674,685 B2 | 3/2010 | Choi et al. |
| 7,682,901 B2 | 3/2010 | Kim |
| 7,723,772 B2 | 5/2010 | Ozawa et al. |
| 7,777,294 B2 | 8/2010 | Taya |
| 8,264,025 B2 | 9/2012 | Lee et al. |
| 8,294,238 B2 | 10/2012 | Kutsukake et al. |
| 8,361,879 B2 | 1/2013 | Gutmann et al. |
| 2001/0009805 A1 | 7/2001 | Ha et al. |
| 2002/0163022 A1 | 11/2002 | Kosugi et al. |
| 2002/0179996 A1 | 12/2002 | Tsuji et al. |
| 2004/0099900 A1 | 5/2004 | Iguchi et al. |
| 2004/0175919 A1 | 9/2004 | Ha et al. |
| 2006/0027880 A1 | 2/2006 | Taya |
| 2006/0160363 A1 | 7/2006 | Furukawa et al. |
| 2006/0220148 A1 | 10/2006 | Furukawa et al. |
| 2007/0007582 A1 | 1/2007 | Hatakeyama |
| 2007/0059876 A1 | 3/2007 | Chi et al. |
| 2007/0148864 A1 | 6/2007 | Hyun |
| 2007/0212848 A1 | 9/2007 | Sandhu et al. |
| 2007/0232019 A1 | 10/2007 | Cho |
| 2008/0017932 A1 | 1/2008 | Furukawa et al. |
| 2008/0237867 A1 | 10/2008 | Wong et al. |
| 2009/0140320 A1 | 6/2009 | Lee et al. |
| 2010/0009513 A1 | 1/2010 | Ishida |
| 2012/0091539 A1 * | 4/2012 | Fan et al. ..................... 257/401 |
| 2013/0056830 A1 | 3/2013 | Ko et al. |
| 2013/0092985 A1 | 4/2013 | Ko et al. |

FOREIGN PATENT DOCUMENTS

| | | |
|---|---|---|
| KR | 1020020096393 A | 12/2002 |
| KR | 1020070002783 A | 1/2007 |
| KR | 10-2007-0028891 | 3/2007 |
| KR | 10-2009-0056454 | 6/2009 |

OTHER PUBLICATIONS

"Image of Device and Method", date unknown, 1 page.

* cited by examiner

SPACER FOR SEMICONDUCTOR STRUCTURE CONTACT

BACKGROUND

Since the development of the integrated circuit (IC), the semiconductor industry has sought to continue to improve the performance or size of the IC. Many of these improvements have focused on smaller feature sizes so that the speed of the IC can be increased. By decreasing the feature sizes, the density of devices (e.g., transistors, diodes, resistors, capacitors, etc.) on the IC has increased. By increasing the density, distances between devices generally decreases, which allows for a smaller resistance and capacitance between devices. Thus, a resistance-capacitance (RC) time constant can be decreased.

Other improvements have focused on using dissimilar materials to achieve beneficial results. Epitaxial growth of dissimilar materials in a substrate has been used to gain beneficial results. For example, the growth of a dissimilar material on a substrate can advantageously introduce stresses and strains in materials to increase the mobility of a charge carrier. Further, the electrical characteristics of an epitaxially grown material, such as a dopant in the material, can be used to gain better a better crystal structure while having a dopant ion to decrease a resistance or increase mobility.

However, epitaxial growth of a material may result in faceting. The faceting may be a problem when etching an opening to the material to form a contact in the opening. If the opening is slightly misaligned, such as over a facet, the opening may not be etched to the epitaxial material. If the opening is not etched to the facet, the conductive material of the contact will not make physical contact with the facet. Hence, the contact may not contact the facet resulting in an open contact.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to a specific context, namely a semiconductor device and structure having an epitaxial growth region with a contact to the epitaxial region. Other embodiments may be applied to structures with similar geometries of regions to which a contact is formed although the regions may not include epitaxial growth.

Figure 1:
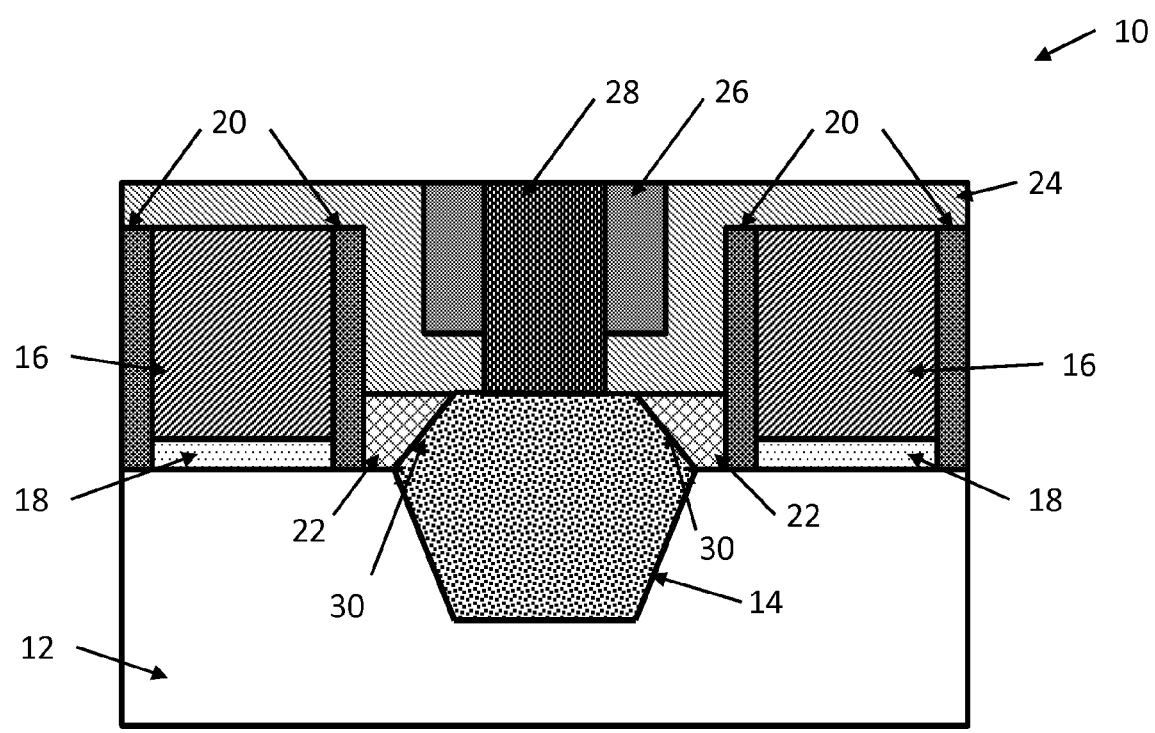
FIG. 1 is a cross section view of a semiconductor structure according to an embodiment.

FIG. 1 shows a semiconductor structure 10 according to an embodiment. The structure includes a substrate 12, an epitaxial region 14, gates 16 over respective gate dielectrics 18, gate spacers 20 along sidewalls of the gates 16 and the gate dielectrics 18, a contact spacer 22, a contact etch stop layer (CESL) 24, an inter-layer dielectric (ILD) layer 26, and a contact 28. In this embodiment, the substrate 12 is silicon and, in other embodiments, includes silicon germanium, silicon carbide, gallium arsenide (GaAs), gallium phosphide (GaP), cadmium sulfide (CdS), the like, or a combination thereof. One combination of gate dielectric 18 and gate 16 is over a channel region in the substrate 12, and the other combination of gate dielectric 18 and gate 16 can be over another channel region or an isolation region, such as an oxide, in the substrate 12.

The epitaxial region 14 is formed in a source/drain region of the substrate 12 and includes facets 30 that are not parallel and not perpendicular to the top surface of the substrate 12. A plane of one of the facets 30, the outer surface of the gate spacer 20 opposite the gate 16, a plane along the top surface of the epitaxial region 14, and possibly the top surface of the substrate 12 form a non-cuboid volume due to the angle of the facet 30. The epitaxial growth region 14 in this embodiment is silicon germanium (SiGe) or silicon phosphorus (SiP), and in other embodiments, the epitaxial growth region 14 is silicon carbide (SiC), indium arsenide (InAs), the like, or a combination thereof.

The contact spacers 22 are disposed in the non-cuboid volumes between respective facets 30 of the epitaxial region 14 and outer surfaces of the gate spacers 20. The CESL 24 is conformally over the gate 16, the contact spacers 22, and the epitaxial region 14. In this embodiment, the contact spacers 22 and the CESL 24 are the same material, such as silicon nitride. Other embodiments contemplate other materials, such as silicon carbon nitride (SiCN), the like, or a combination thereof. In further embodiments, the contact spacers 22 and the CESL 24 comprise different respective materials, such as materials that have a ratio of an etch selectivity of the contact spacer 22 to an etch selectivity of the CESL 24 equal to or less than 3:1.

The ILD layer 26 is formed over the CESL 24, and a contact 28 is formed through the ILD layer 26 and the CESL 24 to the epitaxial region 14. The ILD layer 26 in this embodiment is silicon oxide, and further embodiments contemplate other materials, such as boron phosphor-silicate glass (BPSG), phosphor-silicate glass (PSG), the like, or a combination thereof. In this embodiment, the ILD layer 26 is a material different from the CESL 24 to allow for selectivity of an etch. The contact 28 includes a conductive material, such as a metal like aluminum, copper, tungsten, the like, or a combination thereof, and includes a barrier layer, such as titanium nitride, tantalum nitride, the like, or a combination thereof, disposed between the conductive material and the ILD layer 26.

FIGS. 2 through 9 illustrate a process to form a semiconductor structure according to an embodiment. Although this embodiment is discussed with steps performed in a particular order, steps may be performed in any logical order.

Figure 2:
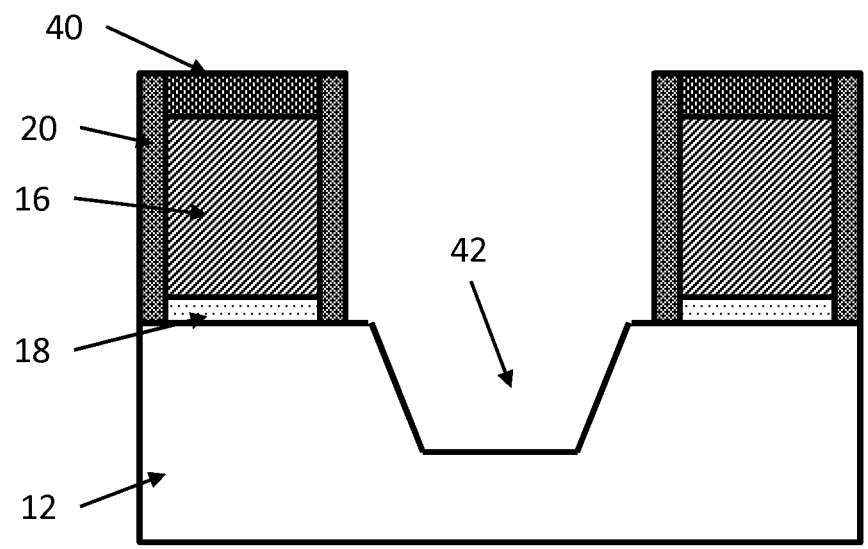
FIGS. 2 through 9 are cross section views during processing to form a semiconductor structure according to an embodiment.

FIG. 2 illustrates the structure at some point during processing. The structure includes patterned gates 16 over gate dielectrics 18, with the gate dielectrics 18 being over a substrate 12. Gate spacers 20 are along sidewalls of the gate dielectrics 18 and the gates 16. A hardmask 40, such as a silicon oxide, is over a top surface of each of the gates 16, and the gate spacers 20 are further along sidewalls of the hardmasks 40. In FIG. 2, a source/drain area is etched to form a recess 42 in the substrate 12. The etch may be by an anisotropic etch.

Figure 3:
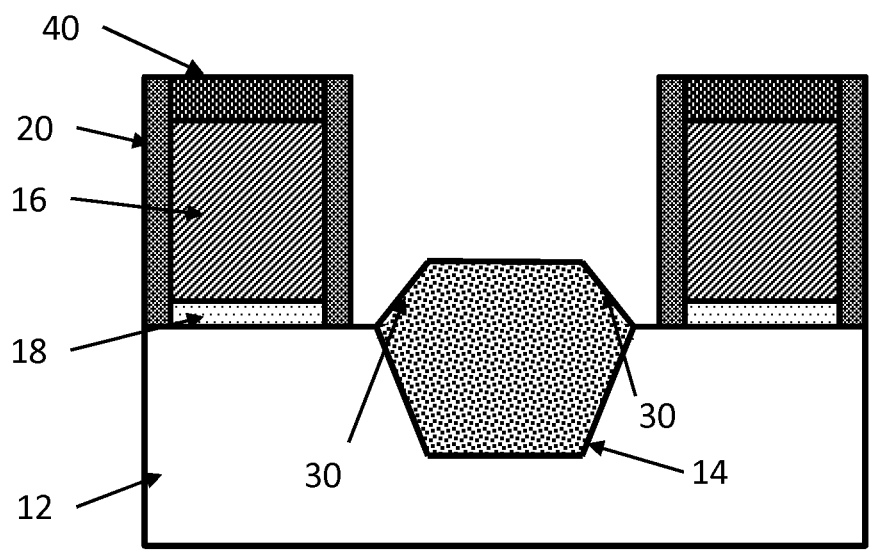

FIG. 3 illustrates an epitaxial growth of an epitaxial region 14 in the recess 42 in the substrate 12. The epitaxial growth can result in the epitaxial region 14 having facets 30 as upper surfaces of the epitaxial region 14. The epitaxial growth can be by, for example, selective epitaxial growth (SEG), molecular beam epitaxy (MBE), the like, or a combination thereof.

Figure 4:
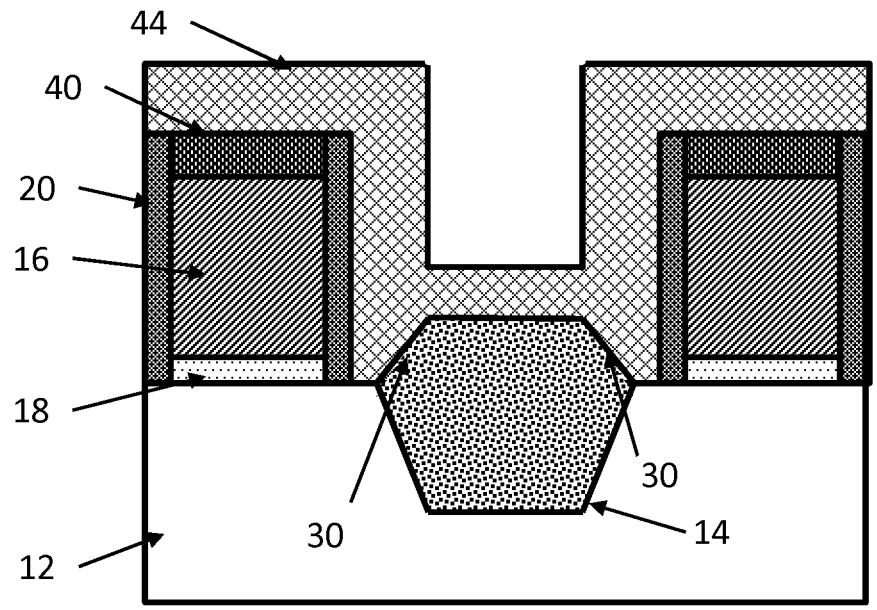

In FIG. 4, a contact spacer layer 44 is deposited over the structure. The contact spacer layer 44 is deposited, for example, by a chemical vapor deposition (CVD), atomic layer deposition (ALD), furnace deposition, the like, or a combination thereof. The deposition is conformal such that the contact spacer layer 44 fills the volume along the facets 30, from the bottom portion of each facet 30 to the top portion of the facet, such as the top surface of the epitaxial region 14, and between each facet 30 and a respective gate spacer 20.

Figure 5:
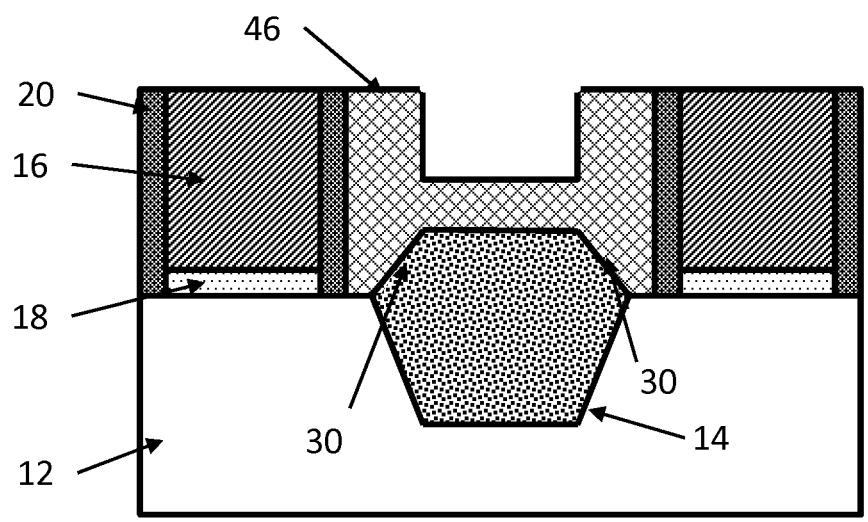

In FIG. 5, the hardmasks 40, upper portions of the gate spacers 20, and upper portions of the contact spacer layer 44 are removed, such as by an anisotropic etch. After the etch an intermediate contact spacer layer 46 remains along sidewalls of the gate spacers 20 and over the epitaxial region 14.

Figure 6:
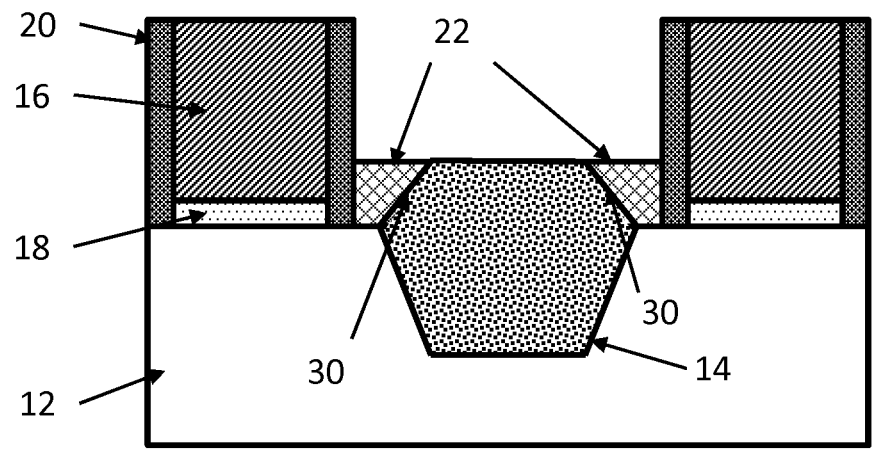

In FIG. 6, portions of the intermediate contact spacer layer 46 are removed by an etch to form contact spacers 22 filling the volume between facets 30 of the epitaxial region 14 and respective gate spacers 20. The etch exposes the top surface of the epitaxial region 14. In this embodiment, the etch is performed using a wet etch, such as by using hydrophosphoric acid ($H_3PO_4$). Other embodiments contemplate other etching techniques, such as wet etching with different etchants or dry etching. Although the contact spacers 22 are illustrated as having a top planar surface coplanar with the top surface of the epitaxial region 14, the contact spacers 22 may be substantially coplanar with the top surface of the epitaxial region 14, such as having a dished top surface from the wet etching.

Figure 7:
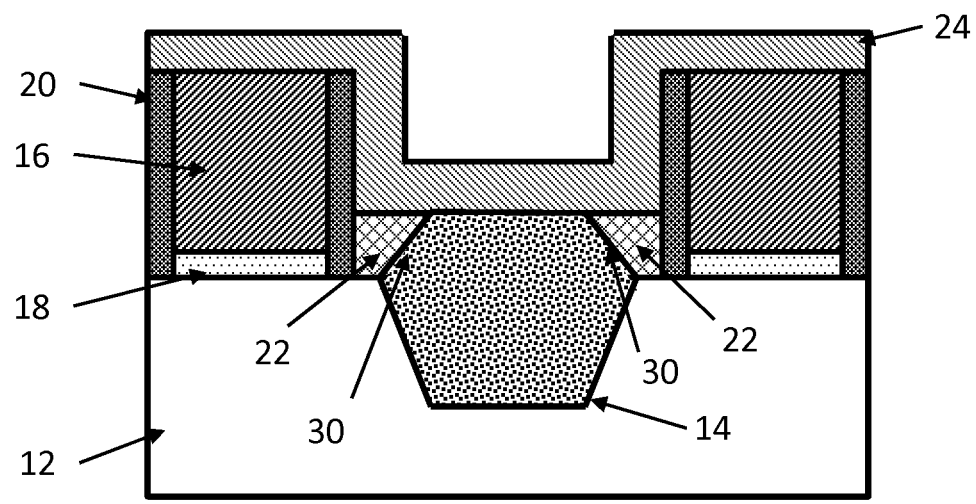

FIG. 7 illustrates the formation of a contact etch stop layer (CESL) 24 over the top surface of the epitaxial region 14, over the top surfaces of the contact spacers 22, along the sidewalls of the gate spacers 20, and over the gates 16. In this embodiment, the material of the CESL 24 is the same as the contact spacers 22. In other embodiments, the materials of the CESL 24 and the contact spacers 22 may be different, for example, with materials having a ratio of an etch selectivity of the contact spacers 22 to an etch selectivity of the CESL 24 less than or equal to 3:1. The formation of the CESL 24 may be by CVD, the like, or a combination thereof.

Figure 8:
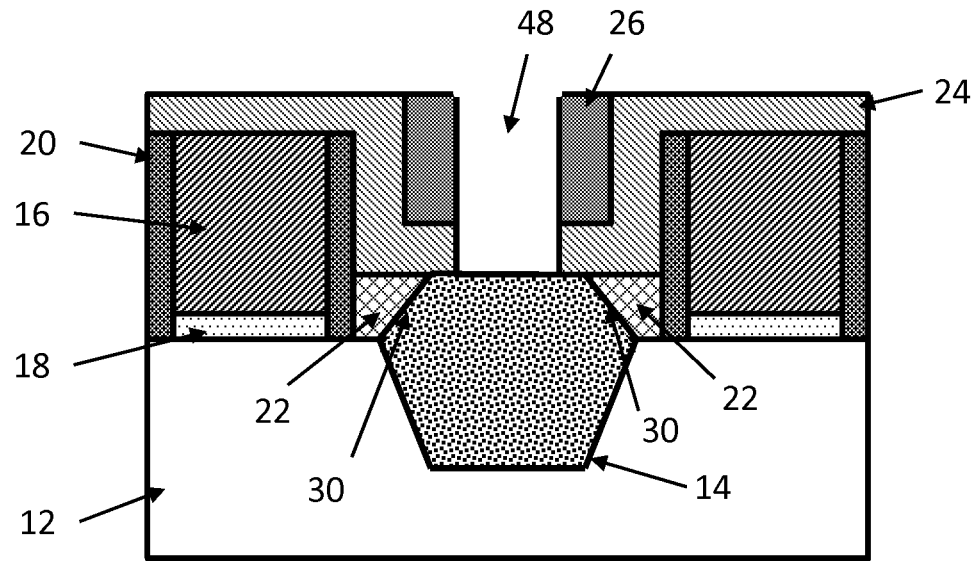

In FIG. 8, an inter-layer dielectric (ILD) layer 26 is deposited. The ILD layer 26 may be deposited using, for example, a high density plasma (HDP) deposition, CVD, flowable deposition, the like, or a combination thereof. Although not specifically illustrated in FIG. 8 and subsequent figure, the ILD layer 26 can have a greater height such that the ILD layer 26 is over the gates 16. Further, after depositing the ILD layer 26, the ILD layer 26 may be planarized, such as by using a chemical mechanical polishing (CMP). An opening 48 is etched through the ILD layer 26 to the epitaxial region 14 in the source/drain region in the substrate 12. The opening 48 can be etched using acceptable photolithography techniques, such a single or dual damascene process. It should be noted that acceptable photolithography techniques may use a first etchant to etch through the ILD layer 26 and a second etchant to etch through the CESL 24. In embodiments where the materials of the CESL 24 and the contact spacers 22 are different, the ratio of the etch selectivity of the contact spacers 22 to the etch selectivity of the CESL 24 with regard to using the second etchant is equal to or less than 3:1.

Figure 9:
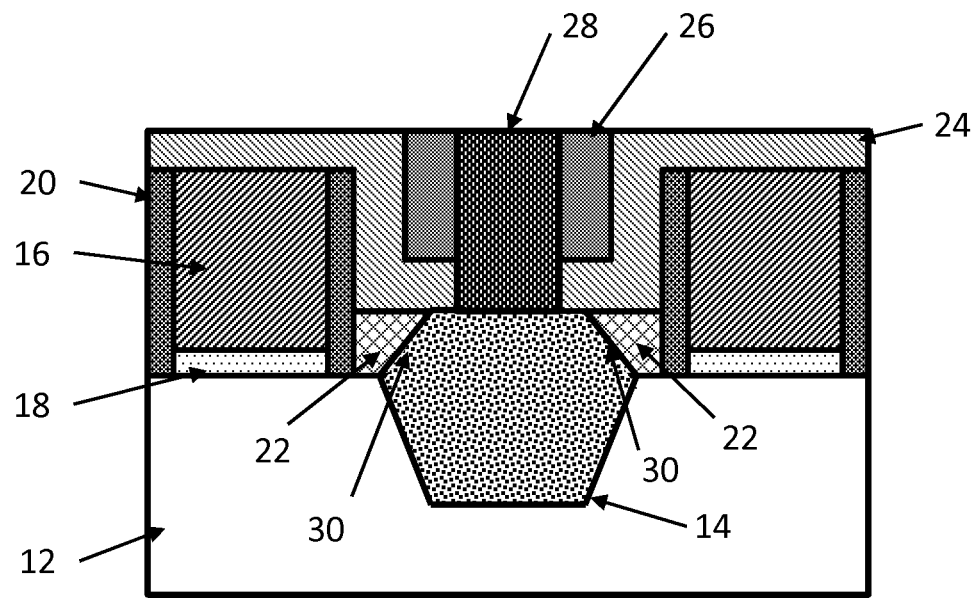

In FIG. 9, a contact 28 is formed in the opening 48. Forming the contact includes, for example, depositing a barrier layer and then depositing a conductive material, such as a metal, in the opening 48. The deposition may be by, for example, CVD, atomic layer deposition (ALD), physical vapor deposition (PVD), the like, or a combination thereof. Excess barrier layer materials and/or conductive materials are removed, such as by CMP.

Embodiments may achieve advantages. First, if a contact spacer is the same material as the CESL or has an appropriate ratio of etch selectivity, the etching of the opening for a contact to the epitaxial region through the CESL can continue through the contact spacer to, for example, a facet of the epitaxial region, rather than stopping at the top surface of the contact spacer due to etch selectivity. Thus, the contact may fully contact the epitaxial region even when a misalignment of a photomask occurs when etching the opening for the contact. Also, embodiments can reduce gate damage when a hardmask is removed. The contact spacer layer may cover gate structure sidewalls in embodiments when the hardmask over the gate structure is removed, thereby providing further protection to reduce damage during the hardmask removal.

An embodiment is a semiconductor structure. The semiconductor structure comprises an epitaxial region, a gate structure, a contact spacer, and an etch stop layer. The epitaxial region is in a substrate. A top surface of the epitaxial region is elevated from a top surface of the substrate, and the epitaxial region has a facet between the top surface of the substrate and the top surface of the epitaxial region. The gate structure is on the substrate. The contact spacer is laterally between the facet of the epitaxial region and the gate structure. The etch stop layer is over and adjoins each of the contact spacer and the top surface of the epitaxial region. A ratio of an etch selectivity of the contact spacer to an etch selectivity of the etch stop layer is equal to or less than 3:1.

Another embodiment is a method for forming a semiconductor structure. The method comprises forming an epitaxial region in a substrate. The epitaxial region has a facet between a top surface of the substrate and a top surface of the epitaxial region. The substrate has a gate structure on the top surface of the substrate. The method further comprises depositing a spacer material laterally between the facet and the gate structure and depositing an etch stop layer over the spacer material and the epitaxial region. The etch stop layer adjoins each of the spacer material and the epitaxial region, and a ratio of an etch selectivity of the spacer material to an etch selectivity of the etch stop layer is equal to or less than 3:1.

A further embodiment is a method for forming a semiconductor structure. The method comprises providing a substrate. A gate is over the substrate; a hardmask is over the gate; and a gate spacer is along a sidewall of the gate. The method further comprises forming a spacer material conformally along an exterior sidewall of the gate spacer and over a source/drain region in the substrate laterally disposed from the gate; removing the hardmask while the spacer material is along the exterior sidewall of the gate spacer; and removing a first portion of the spacer material to expose the source/drain region. A second portion of the spacer material remains laterally disposed between the gate spacer and the source/drain region.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a semiconductor structure, the method comprising:
   forming an epitaxial region in a substrate, the epitaxial region having a facet between a top surface of the substrate and a top surface of the epitaxial region, the substrate having a gate structure on the top surface of the substrate, the gate structure comprising a gate electrode and a gate spacer along a sidewall of the gate electrode;
   depositing a spacer material laterally between the facet and the gate structure, the spacer material adjoining an exterior sidewall of the gate spacer and adjoining the facet; and
   depositing an etch stop layer over the spacer material and the epitaxial region, the etch stop layer adjoining each of the spacer material and the epitaxial region, a ratio of an etch selectivity of the spacer material to an etch selectivity of the etch stop layer being equal to or less than 3:1.

2. The method of claim 1 further comprising:
   depositing an inter-layer dielectric layer on the etch stop layer;
   forming an opening through the inter-layer dielectric layer to the epitaxial region; and
   depositing a conductive material in the opening.

3. The method of claim 1, wherein a hardmask is over the gate electrode, the spacer material being deposited along the exterior sidewall of the gate spacer, the hardmask being removed while the spacer material is along the exterior sidewall of the gate spacer.

4. The method of claim 1 further comprising removing a portion of the spacer material, a top surface of the spacer material being substantially coplanar with the top surface of the epitaxial region.

5. The method of claim 1, wherein the spacer material and the etch stop layer are each silicon nitride.

6. The method of claim 1, wherein the etch stop layer is further formed along a sidewall of the gate structure and over the gate structure.

7. A method for forming a semiconductor structure, the method comprising:
   providing a substrate, a gate being over the substrate, a hardmask being over the gate, a gate spacer being along a sidewall of the gate;
   forming a spacer material conformally along an exterior sidewall of the gate spacer and over a source/drain region in the substrate laterally disposed from the gate;
   removing the hardmask while the spacer material is along the exterior sidewall of the gate spacer; and
   after removing the hardmask, removing a first portion of the spacer material to expose the source/drain region, a second portion of the spacer material remaining laterally disposed between the gate spacer and the source/drain region.

8. The method of claim 7 further comprising depositing an etch stop layer over the source/drain region, the second portion of the spacer material, and the gate.

9. The method of claim 8 further comprising:
   depositing an inter-layer dielectric layer over the etch stop layer;
   etching an opening through the inter-layer dielectric layer to the source/drain region; and
   depositing a conductive material in the opening.

10. The method of claim 7 further comprising epitaxially growing an epitaxial region in the source/drain region, the epitaxial region having a top surface displaced higher than a top surface of the substrate, a facet of the epitaxial region being between the top surface of the substrate and the top surface of the epitaxial region.

11. The method of claim 10, wherein the second portion of the spacer material adjoins the facet and adjoins a sidewall of the gate spacer.

12. The method of claim 11 further comprising forming an etch stop layer over and adjoining the second portion of the spacer material and the top surface of the epitaxial region, the spacer material and the etch stop layer being a same material.

13. The method of claim 12, wherein the spacer material and the etch stop layer are each silicon nitride.

14. A method comprising:
   forming a gate structure on a substrate;
   after forming the gate structure, forming an epitaxial region in the substrate proximate to the gate structure, the epitaxial region having a facet between a top surface of the substrate and a top surface of the epitaxial region;
   after forming the epitaxial region, depositing a spacer material laterally between the facet and the gate structure; and
   depositing an etch stop layer over the spacer material and the epitaxial region, the etch stop layer adjoining each of the spacer material and the epitaxial region, a ratio of an etch selectivity of the spacer material to an etch selectivity of the etch stop layer being equal to or less than 3:1.

15. The method of claim 14 further comprising:
   depositing an inter-layer dielectric layer on the etch stop layer;
   forming an opening through the inter-layer dielectric layer to the epitaxial region; and
   depositing a conductive material in the opening.

16. The method of claim 14, wherein the gate structure comprises a gate electrode and a gate spacer along a sidewall of the gate electrode, a hardmask being over the gate electrode, the spacer material being deposited along an exterior sidewall of the gate spacer, the hardmask being removed while the spacer material is along the exterior sidewall of the gate spacer.

17. The method of claim 14 further comprising removing a portion of the spacer material, a top surface of the spacer material being substantially coplanar with the top surface of the epitaxial region.

18. The method of claim 14, wherein the etch stop layer is further formed along a sidewall of the gate structure and over the gate structure.

19. The method of claim 14, wherein the gate structure comprises a gate electrode and a gate spacer along a sidewall of the gate electrode, the spacer material adjoining an exterior sidewall of the gate spacer and adjoining the facet.

20. The method of claim 14, wherein the spacer material and the etch stop layer are each silicon nitride.

* * * * *